(12) United States Patent
Lee

(10) Patent No.: US 9,337,813 B1
(45) Date of Patent: May 10, 2016

(54) LATCH CIRCUIT AND LATCH CIRCUIT ARRAY INCLUDING THE SAME

(71) Applicant: SK hynix Inc., Gyeonggi-do (KR)

(72) Inventor: Jae-Seung Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,440

(22) Filed: Dec. 12, 2014

(30) Foreign Application Priority Data

Oct. 22, 2014 (KR) .......................... 10-2014-0143284

(51) Int. Cl.
 *H03K 3/356* (2006.01)
(52) U.S. Cl.
 CPC .................................. *H03K 3/356104* (2013.01)
(58) Field of Classification Search
 None
 See application file for complete search history.

(56) References Cited

U.S. PATENT DOCUMENTS

| 7,920,410 | B1 | 4/2011 | Lee et al. | |
| 8,077,500 | B2 * | 12/2011 | Xu | H03K 19/0033 365/154 |
| 8,154,912 | B2 | 4/2012 | Pedersen | |
| 8,432,724 | B2 * | 4/2013 | White | G11C 7/02 365/154 |
| 8,750,026 | B1 * | 6/2014 | Liu | G11C 11/412 365/154 |
| 2015/0062995 | A1 * | 3/2015 | Sang | G11C 11/4125 365/72 |
| 2015/0262635 | A1 * | 9/2015 | Joo | G11C 7/1087 365/72 |

* cited by examiner

*Primary Examiner* — Long Nguyen
(74) *Attorney, Agent, or Firm* — IP & T Group LLP

(57) ABSTRACT

A latch circuit may include: first to Nth storage nodes where N is an even number equal to or more than four; first to Nth pairs of transistors each including a PMOS transistor and an NMOS transistor which are coupled in series through a corresponding storage node among the first to Nth storage nodes, wherein each of the first to Nth storage nodes is coupled to a gate of the NMOS transistor of the transistor pair at the previous stage and a gate of the PMOS transistor of the transistor pair at the next stage; first to Nth PMOS transistors suitable for driving corresponding storage nodes among the first to Nth storage nodes to a high level; and first to Nth NMOS transistors suitable for driving corresponding storage nodes among the first to Nth storage nodes to a low level.

13 Claims, 4 Drawing Sheets

LATCH CIRCUIT AND LATCH CIRCUIT ARRAY INCLUDING THE SAME

CROSS-REFERENCE TO RELATED APPLICATIONS

The present application claims priority of Korean Patent Application No. 10-2014-0143284, filed on Oct. 22, 2014, which is incorporated herein by reference in its entirety.

BACKGROUND

1. Field

This patent document relates to a latch circuit and a latch circuit array including the same.

2. Description of the Related Art

A latch circuit for storing data is one of the most frequently used circuits amongst all types of semiconductor devices. With the increase in integration degree of semiconductor devices, the capacitance of storage nodes in the latch circuits has decreased, leading to an increase in soft errors. Soft errors are the corruption of data in storage nodes of a latch circuit, commonly cause by cosmic rays, by way of alpha particles.

A variety of latch circuits with resistance to soft errors have been proposed. One of the proposed latch circuits is the dual interlocked storage cell (DICE), which has been disclosed in Calin et al., "Upset Hardened Memory Design for Submicron CMOS Technology", IEEE Transactions on Nuclear Science, vol 43, No. 6 Dec. 1996.

FIG. 1 is a circuit diagram illustrating the DICE.

Referring to FIG. 1, the latch circuit includes first to fourth storage nodes SN1 to SN4, first to fourth pairs of transistors 110 to 140, and an input unit 150.

The pairs of transistors 110 to 140 include PMOS transistors 111 to 141 and NMOS transistors 112 to 142, respectively, which are coupled in series at corresponding storage nodes SN1 to SN4. Gates of the NMOS transistor of the previous one of the first to fourth pairs of transistors 110 to 140 and the PMOS transistor of the next one of the first to fourth pairs of transistors 110 to 140 may be coupled at one of the storage nodes SN1 to SN4 included in the current one of the first to fourth pairs of transistors 110 to 140. For example, the gates of the NMOS transistor 112 of the first pair of transistors 110 and the PMOS transistor 131 of the third pair of transistors 130 may be coupled at the second storage node SN2 of the second pair of transistors 120. The next one of the last pair of transistors 140 may be the first pair of transistors 110. Similarly, the previous one of the first pair of transistors 110 may be the last pair of transistors 140.

The input unit 150 includes four NMOS transistors 151 to 154. The input unit 150 is turned on when a clock CK is activated, and transmits data of a data line D to the storage nodes SN1 and SN3, or transmits data of an inverted data line DB to the storage nodes SN2 and SN4. The storage nodes SN1 and SN3 have a reverse polarity to the storage nodes SN2 and SN4.

The latch circuit of FIG. 1 has strong immunity to soft errors caused by cosmic rays. Only when the data of two or more storage nodes SN1 to SN4 simultaneously changes due to cosmic rays will the data stored in the latch circuit be corrupted by soft errors. For example, although the data of the first storage node SN1 changes from a logic high ("H") to a logic low ("L") due to the cosmic rays when the data set 'H, L, H, L' is respectively stored in the storage nodes SN1 to SN4, the data of the first storage node SN1 may change from "L" to "H" due to the PMOS transistor 111. In other words, soft errors do not occur unless the data of two or more storage nodes simultaneously changes due to cosmic rays in the latch circuit. The probability of simultaneous data change of two or more storage nodes due to the cosmic rays is extremely low.

The latch circuit of FIG. 1 has the advantage of being resistant to errors caused by cosmic rays. However, since the data of the latch circuit are not easily changed, an error may easily occur while data are inputted to the latch circuit.

SUMMARY

Various embodiments are directed to a latch circuit having strong immunity to soft errors and receiving input data without an error, and a latch circuit array including the same.

In an embodiment, a latch circuit may include: first to Nth storage nodes where N is an even number equal to or more than four; first to Nth pairs of transistors each including a PMOS transistor and an NMOS transistor which are coupled in series through a corresponding storage node among the first to Nth storage nodes, wherein each of the first to Nth storage nodes is coupled to a gate of the NMOS transistor of the transistor pair at the previous stage and a gate of the PMOS transistor of the transistor pair at the next stage; first to Nth PMOS transistors suitable for driving corresponding storage nodes among the first to Nth storage nodes to a high level; and first to Nth NMOS transistors suitable for driving corresponding storage nodes among the first to Nth storage nodes to a low level. When first data are inputted to the latch circuit, the even-numbered nodes among the first to Nth storage nodes may be set to a high level by the even-numbered transistors among the first to Nth PMOS transistors, and the odd-numbered nodes among the first to Nth storage nodes may be set to a low level by the odd-numbered transistors among the first to Nth NMOS transistors.

When second data are inputted to the latch circuit, the odd-numbered nodes among the first to Nth storage nodes may be set to a high level by the odd-numbered transistors among the first to Nth PMOS transistors, and the even-numbered nodes among the first to Nth storage nodes may be set to a low level by the even-numbered transistors among the first to Nth NMOS transistors.

In an embodiment, a latch circuit may include: first to fourth storage nodes; first to fourth pairs of transistors each including a PMOS transistor and an NMOS transistor which are coupled in series through a corresponding storage node among the first to fourth storage nodes, wherein each of the first to fourth storage nodes is coupled to a gate of the NMOS transistor of the transistor pair at the previous stage and a gate of the PMOS transistor of the transistor pair at the next stage; first and third PMOS transistors suitable for transmitting data of a data line to the first and third storage nodes in response to an inverted select signal; and second and fourth PMOS transistors suitable for transmitting data of an inverted data line to the second and fourth storage nodes in response to an inverted reset signal.

The latch circuit may further include: first and third NMOS transistors suitable for transmitting the data of the data line to the first and third storage nodes in response to a reset signal; and second and fourth NMOS transistors suitable for transmitting the data of the inverted data line to the second and fourth storage nodes in response to a select signal.

In an embodiment, a latch circuit array may include: a first latch circuit suitable for storing data of a data line in response to a reset signal and a first select signal; and a second latch circuit suitable for storing data of the data line in response to the reset signal and a second select signal. Each of the first and second latch circuits may include: first to fourth storage nodes; first to fourth pairs of transistors each including a PMOS transistor and an NMOS transistor which are coupled in series through a corresponding storage node among the first to fourth storage nodes, wherein each of the first to fourth storage nodes is coupled to a gate of the NMOS transistor of the transistor pair at the previous stage and a gate of the PMOS transistor of the transistor pair at the next stage; first and third PMOS transistors suitable for transmitting the data of the data line to the first and third storage nodes in response to an inverted signal of a select signal corresponding thereto; and second and fourth PMOS transistors suitable for transmitting the data of the inverted data line to the second and fourth storage nodes in response to an inverted signal of the reset signal.

Each of the first and second latch circuits may further include: first and third NMOS transistors suitable for transmitting the data of the data line to the first and third storage nodes in response to the reset signal; and second and fourth NMOS transistors suitable for transmitting the data of the inverted data line to the second and fourth storage nodes in response to a select signal corresponding thereto.

In an embodiment, a latch circuit may include: 1st to Nth pairs of transistors, each of which comprises a PMOS transistor and an NMOS transistor coupled in series with each other through a corresponding one among 1st to Nth storage nodes; 1st to Nth driving PMOS transistors suitable for driving the 1st to Nth storage nodes to a high level, respectively; and 1st to Nth driving NMOS transistors suitable for driving the 1st to Nth storage nodes to a low level, respectively, wherein one of 1st and 2nd groups of the driving PMOS and NMOS transistors drives the 1st to Nth storage nodes according to data inputted to the latch circuit, wherein the 1st group comprises even-numbered ones of the driving PMOS transistors and odd-numbered ones of the driving NMOS transistors, wherein the 2nd group comprises odd-numbered ones of the driving PMOS transistors and even-numbered ones of the driving NMOS transistors, wherein the PMOS transistor is coupled to one of the storage nodes included in a previous one of the pairs of transistors at a gate thereof, and the NMOS transistor is coupled to one of the storage nodes included in a next one of the pairs of transistors at a gate thereof, and wherein N is an even number equal to or more than four.

In an embodiment, a latch circuit may include: 1st to Nth pairs of transistors, each of which comprises a PMOS transistor and an NMOS transistor coupled in series with each other through a corresponding one among 1st to Nth storage nodes; a 1st group of driving transistors suitable for driving even-numbered ones of the storage nodes to a high level, and odd-numbered ones of the storage nodes to a low level; and a 2nd group of driving transistors suitable for driving odd-numbered ones of the storage nodes to a high level, and even-numbered ones of the storage nodes to a low level, wherein the PMOS transistor is coupled to one of the storage nodes included in previous one of the pairs of transistors at a gate thereof, and the NMOS transistor is coupled to one of the storage nodes included in a next one of the pairs of transistors at a gate thereof, and wherein N is an even number equal to or more than four.

The 1st group of driving transistors may include: a 1st group of driving PMOS transistors suitable for driving the even-numbered ones of the storage nodes to a high level; and a 1st group of driving NMOS transistors suitable for driving the odd-numbered ones of the storage nodes to a low level.

The 1st group of driving PMOS transistors may transmit inverted data to the even-numbered ones of the storage nodes in response to an inverted reset signal, and the 1st group of driving NMOS transistors may transmit data to the odd-numbered ones of the storage nodes in response to a reset signal.

The 2nd group of driving transistors may include: a 2nd group of driving PMOS transistors suitable for driving the odd-numbered ones of the storage nodes to a high level; and a 2nd group of driving NMOS transistors suitable for driving the even-numbered ones of the storage nodes to a low level.

The 2nd group of driving PMOS transistors may transmit data to the odd-numbered ones of the storage nodes in response to an inverted select signal, and the 2nd group of driving NMOS transistors may transmit inverted data to the even-numbered ones of the storage nodes in response to a select signal.

DETAILED DESCRIPTION

Figure 1:
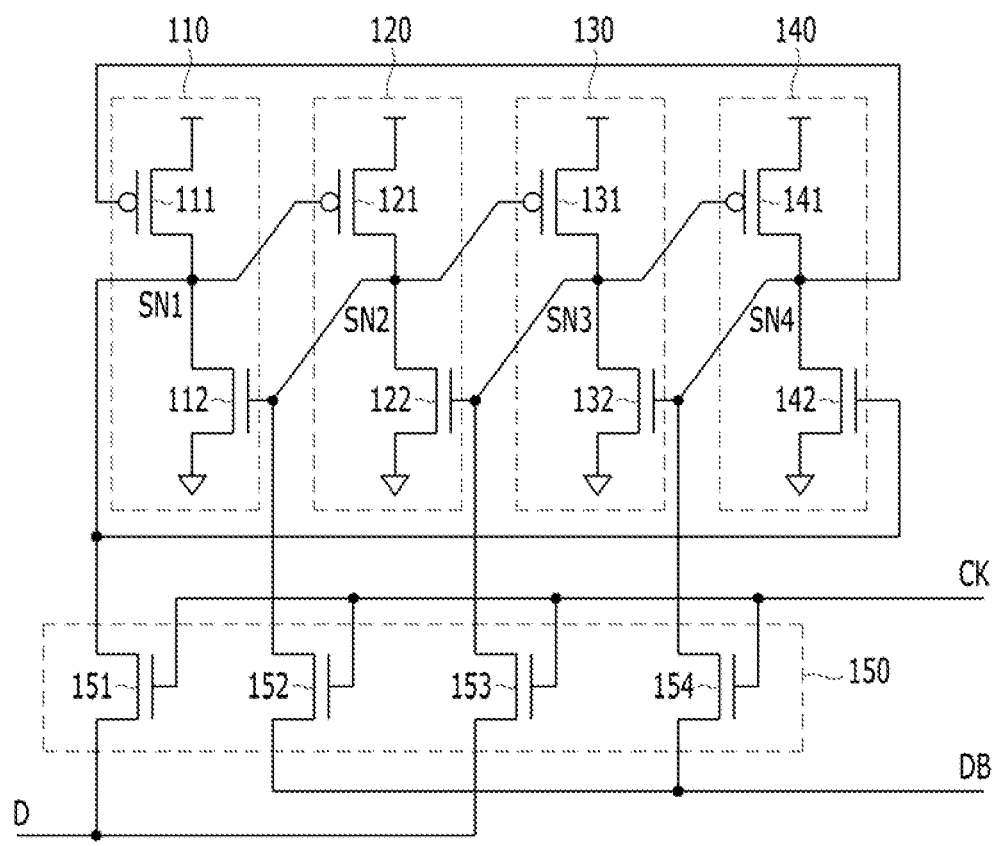
FIG. 1 is a circuit diagram illustrating an existing latch circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2A:
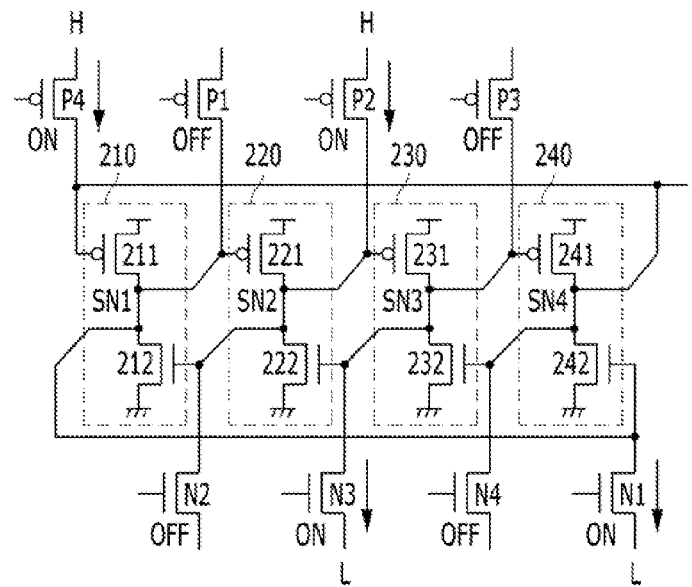
FIGS. 2A and 2B are circuit diagrams illustrating an operation of a latch circuit in accordance with an embodiment of the present invention.
Figure 2B:
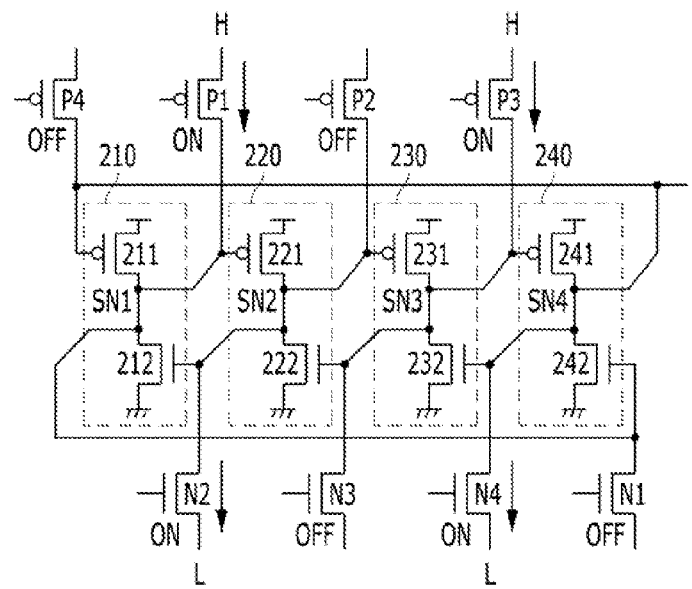

FIGS. 2A and 2B are circuit diagrams illustrating an operation of a latch circuit in accordance with an embodiment of the present invention. FIGS. 2A and 2B illustrate cases of first and second data input to the latch circuit, respectively.

Referring to FIGS. 2A and 2B, the latch circuit may include first to fourth storage nodes SN1 to SN4, first to fourth pairs of transistors 210 to 240, first to fourth PMOS transistors P1 to P4, and first to fourth NMOS transistors N1 to N4.

The first to fourth pairs of transistors 210 to 240 may include PMOS transistors 211 to 241 and NMOS transistors 221 to 242, respectively, which are coupled in series at a corresponding one of the storage nodes SN1 to SN4. Gates of the NMOS transistor of the previous one of the first to fourth pairs of transistors 210 to 240 and the PMOS transistor of the next one of the first to fourth pairs of transistors 210 to 240 may be coupled at one of the storage nodes SN1 to SN4 included in the current one of the first to fourth pairs of transistors 210 to 240. For example, the gates of the NMOS transistor 212 of the first pair of transistors 210 and the PMOS transistor 231 of the third pair of transistors 230 may be coupled at the second storage node SN2 of the second pair of transistors 220. The next one of the last pair of transistors 240 may be the first pair of transistors 210. Similarly, the previous one of the first pair of transistors 210 may be the last pair of transistors 240.

The first to fourth PMOS transistors P1 to P4 may drive the first to fourth storage nodes SN1 to SN4 to a logic high ("H") level, respectively. For example, the third PMOS transistor P3 may be turned on to drive the third storage node SN3 to the "H" level.

The first to fourth NMOS transistors N1 to N4 may drive the first to fourth storage nodes SN1 to SN4 to a logic low (L) level. For example, the fourth NMOS transistor N4 may be turned on to drive the fourth storage node SN4 to the "L" level.

Referring to FIG. 2A, the first to storage nodes SN1 to SN4 may have a state of (L, H, L, H) according to the first data inputted to the latch circuit. When the first data are inputted, the second and fourth PMOS transistors P2 and P4 may be turned on to drive the second and fourth storage nodes SN2 and SN4 to "H" level, and the first and third NMOS transistors N1 and N3 may be turned on to drive the first and third storage nodes SN1 and SN3 to "L" level. At this time, the first and third PMOS transistors P1 and P3, and the second and fourth NMOS transistors N2 and N4 may be turned off. When the first data are inputted to the latch circuit, the storage nodes SN1 and SN3 may be driven to "H" level through the PMOS transistors P1 and P3, and the storage nodes SN2 and SN4 may be driven to "L" level through the NMOS transistors N2 and N4. Since the storage nodes SN1 and SN3 are driven to "H" level through the PMOS transistors P1 and P3 and the storage nodes N2 and N4 are driven to "L" level through the NMOS transistors N2 and N4, signals may be transmitted to the storage nodes SN1 to SN4 without loss, which makes it possible to reduce errors when data are inputted to the latch circuit.

Referring to FIG. 2B, the storage nodes SN1 to SN4 may have a state of (H, L, H, L) according to the second data inputted to the latch circuit. When the second data are inputted, the first and third PMOS transistors P1 and P3 may be turned on to drive the first and third storage nodes SN1 and SN3 to "H" level, and the second and fourth NMOS transistors N2 and N4 may be turned on to drive the second and fourth storage nodes SN2 and SN4 to "L" level. At this time, the second and fourth PMOS transistors P2 and P4, and the first and third NMOS transistors N1 and N3 may be turned off. When the second data are inputted to the latch circuit, the storage nodes SN2 and SN4 may be driven to "H" level through the PMOS transistors P2 and P4, and the storage nodes SN1 and SN3 may be driven to "L" level through the NMOS transistors N1 and N3. Since the storage nodes SN2 and SN4 are driven to "H" level through the PMOS transistors P2 and P4 and the storage nodes SN1 and SN3 are driven to "L" level through the NMOS transistors N1 and N3, signals may be transmitted to the storage nodes SN1 to SN4 without a loss, which makes it possible to reduce errors when data are inputted to the latch circuit.

Referring to FIGS. 2A and 2B, the storage nodes of the latch circuit may be driven to "H" level only through the PMOS transistors, and driven to "L" level only through the NMOS transistors. Thus, the data may be transmitted to the latch circuit at a high transmission rate or a low loss rate. As a result, it is possible to minimize errors which occur while the data are inputted to the latch circuit.

FIGS. 2A and 2B exemplarily illustrate 4 storage nodes SN1 to SN4, 4 pairs of transistors 210 to 240, 4 PMOS transistors P1 to P4, and 4 NMOS transistors N1 to N4, the number of which may expanded to any even number greater than 4 without departing from the spirit and scope of the invention as defined in the following claims.

Figure 3:
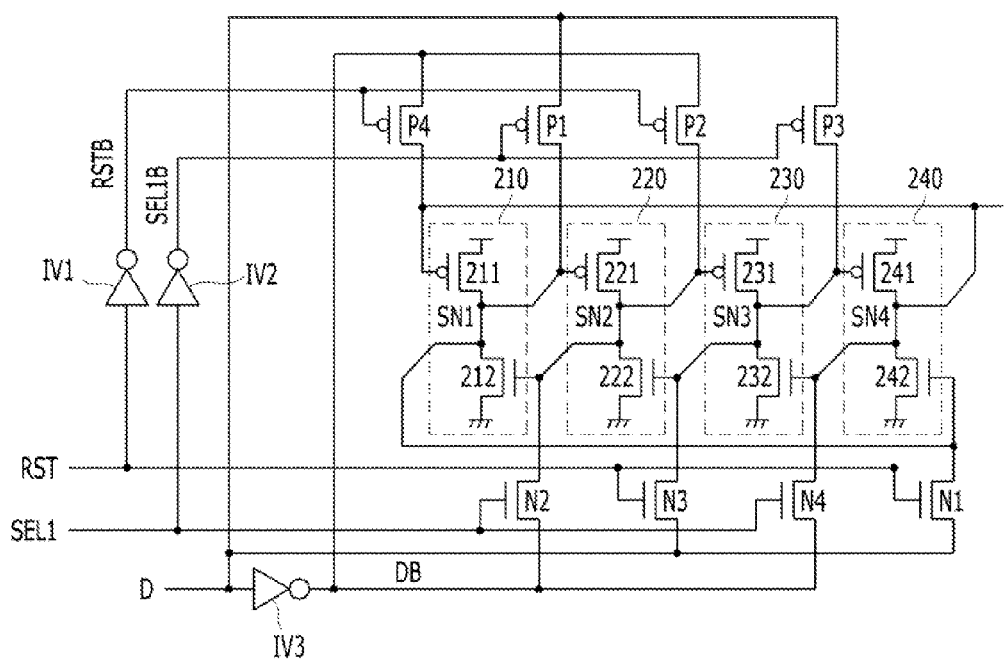
FIG. 3 is a circuit diagram illustrating a latch circuit shown in FIGS. 2A and 2B.

FIG. 3 is a circuit diagram illustrating the latch circuit described with reference to FIGS. 2A and 2B.

Referring to FIG. 3, in addition to the first to fourth storage nodes SN1 to SN4, the first to fourth pairs of transistors 210 to 240, the first to fourth PMOS transistors P1 to P4, and the first to fourth NMOS transistors N1 to N4, as described above with reference to FIGS. 2A and 2B, the latch circuit may receive and store data, which is transmitted through a data line D and an inverted data line DB, in the storage nodes SN1 to SN4 according to control of a select signal SEL, an inverted select signal SELB, a reset signal RST, and an inverted reset signal RSTB. Furthermore, the latch circuit may include inverters IV1 to IV3. The first inverter IV1 may invert the reset signal RST to the inverted reset signal RSTB, the second inverter IV2 may invert the select signal SEL to the inverted selected signal SELB, and the third inverter IV3 may invert the data of the data line D to the data of the inverted data line DB.

The first and third PMOS transistors P1 and P3 may transmit the data of the data line D to the first and third storage nodes SN1 and SN3 in response to the inverted select signal SELB. The second and fourth PMOS transistors P2 and P4 may transmit the data of the inverted data line DB to the second and fourth storage nodes SN2 and SN4 in response to the inverted reset signal RSTB.

The first and third NMOS transistors N1 and N3 may transmit the data of the data line D to the first and third storage nodes SN1 and SN3 in response to the reset signal RST. The second and fourth NMOS transistors N2 and N4 may transmit the data of the inverted data line DB to the second and fourth storage nodes SN2 and SN4 in response to the select signal SEL.

Table 1 below shows the logic levels of the reset signal RST, the select signal SEL, and the data line D according to the first data (L, H, L, H) and the second data (H, L, H, L) inputted to the latch circuit.

TABLE 1

| First data | | | Second data | | |
|---|---|---|---|---|---|
| RST | SEL | D | RST | SEL | D |
| H | L | L | L | H | H |

When the signals RST and SEL and the data line D are controlled as shown in Table 1, the first data may be inputted to the latch circuit in the same manner as illustrated in FIG. 2A, and the second data may be inputted to the latch circuit in the same manner as illustrated in FIG. 2B.

In FIG. 3, the reset signal RST and the inverted reset signal RSTB, the select signal SEL and the inverted select signal SELB, and the data line D and the inverted data line DB may be correlated. For example, since the inverted reset signal RSTB is a signal obtained by inverting the reset signal RST, the inverted reset signal RSTB was named as such. However, the reset signal RST may be named an inverted reset signal in a state where the inverted reset signal RSTB is set to a reset signal.

The data stored in the latch circuit may be provided to another circuit outside the latch circuit through any one of the storage nodes SN1 to SN4.

Figure 4:
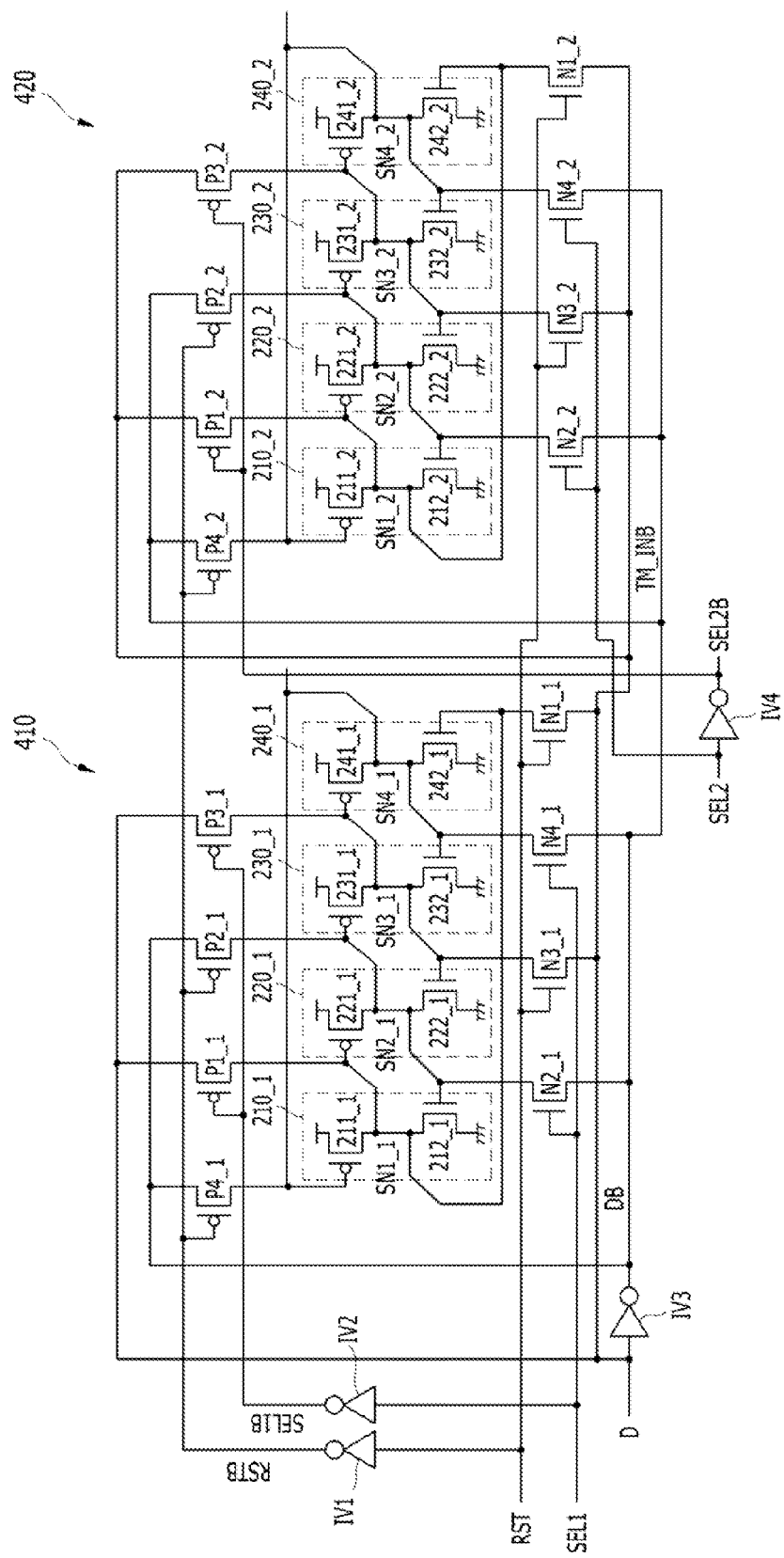
FIG. 4 is a circuit diagram illustrating a latch circuit array in accordance with an embodiment of the present invention.

FIG. 4 is a circuit diagram illustrating a latch circuit array in accordance with an embodiment of the present invention. FIG. 4 illustrates a plurality of latch circuits, each of which is described with reference to FIGS. 2A, 2B, and 3.

Referring to FIG. 4, the latch circuit array may include a first latch circuit 410 and a second latch circuit 420.

Each of the first and second latch circuits 410 and 420 may be the same as the latch circuit described with reference to FIGS. 2A, 2B, and 3. The first and second latch circuits 410 and 420 may share the reset signal RST, the inverted rest signal RSTB, the data line D, and the inverted data line DB. However, the first and second latch circuits 410 and 420 may not share select signals SEL1 and SEL2 and inverted select signals SEL1B and SEL2B. That is, the first latch circuit 410 may be controlled according to the first select signal SEL1 and the first inverted select signal SEL1B while the second latch circuit 420 may be controlled according to the second select signal SEL2 and the second inverted select signal SEL2B. Since the latch circuit array of FIG. 4 uses the two select signals SEL1 and SEL2, the number of inverters IV1 to IV4 may be increased by 1, compared to the configuration of FIG. 3.

During a reset operation, the first data may be simultaneously inputted to the first and second latch circuits 410 and 420. The reset operations may be performed on the first and second latch circuits 410 and 420 at the same time. During a set operation, the second data may be separately inputted to the first and second latch circuits 410 and 420. The set operations may be separately performed on the first and second latch circuits 410 and 420.

Through a proper combination of the reset operation and the set operation, desired data may be inputted to the first and second latch circuits 410 and 420. For example, when the first data are to be stored in the first and second latch circuits 410 and 420, the reset operation may be performed. Furthermore, when the first and second data are to be stored in the first and second latch circuits 410 and 420, respectively, the set operation may be performed on the second latch circuit 420 after the reset operation is performed on the first and second latch circuits 410 and 420.

Table 2 below shows the logic levels of the reset signal RST, the first select signal SEL1, the second select signal SEL2, and the data line D, during each of the reset operations, the set operation for the first latch circuit 410, and the set operation for the second latch circuit 420.

TABLE 2

| Reset | | | | First latch circuit set | | | | Second latch circuit set | | | |
|---|---|---|---|---|---|---|---|---|---|---|---|
| RST | SEL1 | SEL2 | D | RST | SEL1 | SEL2 | D | RST | SEL1 | SEL2 | D |
| H | L | L | L | L | H | L | H | L | L | H | H |

Each of the first and second latch circuits 410 and 420 may be operated in the same manner as illustrated in FIG. 2A during the reset operation, and operated in the same manner as illustrated in FIG. 2B during the set operation.

In accordance with the embodiments of the present invention, high data may be transmitted to the storage nodes of the latch circuit through the PMOS transistors, and low data may be transmitted to the storage nodes of the latch circuit through the NMOS transistors. Thus, the data may be inputted to the latch circuit without an error.

Although various embodiments have been described for illustrative purposes, it will be apparent to those skilled in the art that various changes and modifications may be made without departing from the spirit and scope of the invention as defined in the following claims.

What is claimed is:

1. A latch circuit comprising:
   first to Nth storage nodes where N is an even number equal to or more than four;
   first to Nth pairs of transistors each comprising a PMOS transistor and an NMOS transistor which are coupled in series through a corresponding storage node among the first to Nth storage nodes, wherein each of the first to Nth storage nodes is coupled to a gate of the NMOS transistor of the transistor pair at the previous stage and a gate of the PMOS transistor of the transistor pair at the next stage;
   first to Nth PMOS transistors suitable for driving corresponding storage nodes among the first to Nth storage nodes to a high level; and
   first to Nth NMOS transistors suitable for driving corresponding storage nodes among the first to Nth storage nodes to a low level,
   wherein when first data are inputted to the latch circuit, the even-numbered nodes among the first to Nth storage nodes are set to a high level by the even-numbered transistors among the first to Nth PMOS transistors, and the odd-numbered nodes among the first to Nth storage nodes are set to a low level by the odd-numbered transistors among the first to Nth NMOS transistors.

2. The latch circuit of claim 1, wherein when second data are inputted to the latch circuit, the odd-numbered nodes among the first to Nth storage nodes are set to a high level by the odd-numbered transistors among the first to Nth PMOS transistors, and the even-numbered nodes among the first to Nth storage nodes are set to a low level by the even-numbered transistors among the first to Nth NMOS transistors.

3. A latch circuit comprising:
   first to fourth storage nodes;
   first to fourth pairs of transistors each comprising a PMOS transistor and an NMOS transistor which are coupled in series through a corresponding storage node among the first to fourth storage nodes, wherein each of the first to fourth storage nodes is coupled to a gate of the NMOS transistor of the transistor pair at the previous stage and a gate of the PMOS transistor of the transistor pair at the next stage;
   first and third PMOS transistors suitable for transmitting data of a data line to the first and third storage nodes in response to an inverted select signal; and
   second and fourth PMOS transistors suitable for transmitting data of an inverted data line to the second and fourth storage nodes in response to an inverted reset signal.

4. The latch circuit of claim 3, further comprising:
   first and third NMOS transistors suitable for transmitting the data of the data line to the first and third storage nodes in response to a reset signal; and
   second and fourth NMOS transistors suitable for transmitting the data of the inverted data line to the second and fourth storage nodes in response to a select signal.

5. The latch circuit of claim 4, further comprising:
   a first inverter suitable for receiving the reset signal and outputting the inverted reset signal;
   a second inverter suitable for receiving the select signal and outputting the inverted select signal; and
   a third inverter suitable for receiving the data of the data line and the data of the inverted data line.

6. The latch circuit of claim 4, wherein when the first data are inputted to the latch circuit, the reset signal is set to a high level, the select signal is set to a low level, and the data line is set to a low level.

7. The latch circuit of claim 4, wherein when the second data are inputted to the latch circuit, the reset signal is set to a low level, the select signal is set to a high level, and the data line is set to a high level.

8. A latch circuit array comprising:
- a first latch circuit suitable for storing data of a data line in response to a reset signal and a first select signal; and
- a second latch circuit suitable for storing data of the data line in response to the reset signal and a second select signal,
- wherein each of the first and second latch circuits comprises:
- first to fourth storage nodes;
- first to fourth pairs of transistors each comprising a PMOS transistor and an NMOS transistor which are coupled in series through a corresponding storage node among the first to fourth storage nodes, wherein each of the first to fourth storage nodes is coupled to a gate of the NMOS transistor of the transistor pair at the previous stage and a gate of the PMOS transistor of the transistor pair at the next stage;
- first and third PMOS transistors suitable for transmitting the data of the data line to the first and third storage nodes in response to an inverted signal of a select signal corresponding thereto; and
- second and fourth PMOS transistors suitable for transmitting the data of the inverted data line to the second and fourth storage nodes in response to an inverted signal of the reset signal.

9. The latch circuit array of claim 8, wherein each of the first and second latch circuits further comprises:
- first and third NMOS transistors suitable for transmitting the data of the data line to the first and third storage nodes in response to the reset signal; and
- second and fourth NMOS transistors suitable for transmitting the data of the inverted data line to the second and fourth storage nodes in response to a select signal corresponding thereto.

10. The latch circuit array of claim 9, further comprising:
- a first inverter suitable for receiving the reset signal and outputting the inverted reset signal;
- a second inverter suitable for receiving the first select signal and outputting a first inverted select signal;
- a third inverter suitable for receiving the second select signal and outputting a second inverted select signal; and
- a fourth inverter suitable for receiving the data of the data line and outputting the data of the inverted data line.

11. The latch circuit array of claim 9, wherein when the first data are inputted to the first latch circuit and the second latch circuit, the reset signal is set to a high level, the first and second select signals are set to a low level, and the data line is set to a low level.

12. The latch circuit array of claim 9, wherein when the second data are inputted to the first latch circuit, the reset signal is set to a low level, the first select signal is set to a high level, and the data line is set to a high level.

13. The latch circuit array of claim 9, wherein when the second data are inputted to the second latch circuit, the reset signal is set to a low level, the second select signal is set to a high level, and the data line is set to a high level.

* * * * *